United States Patent
Rangarajan et al.

(10) Patent No.: US 6,329,124 B1
(45) Date of Patent: Dec. 11, 2001

(54) METHOD TO PRODUCE HIGH DENSITY MEMORY CELLS AND SMALL SPACES BY USING NITRIDE SPACER

(75) Inventors: Bharath Rangarajan, Santa Clara; Bhanwar Singh, Morgan Hill; Michael K. Templeton, Atherton, all of CA (US)

(73) Assignee: Advanced Micro Devices, Sunnyvale, CA (US)

( * ) Notice: Subject to any disclaimer, the term of this patent is extended or adjusted under 35 U.S.C. 154(b) by 0 days.

(21) Appl. No.: 09/320,417

(22) Filed: May 26, 1999

(51) Int. Cl.[7] .............................. G03F 7/26; H01L 21/465
(52) U.S. Cl. .................. 430/313; 430/325; 430/316; 438/639; 438/637
(58) Field of Search ................. 430/312, 313, 430/271.1, 325, 316; 438/637, 639, 669

(56) References Cited

U.S. PATENT DOCUMENTS

| | | | |
|---|---|---|---|
| 4,415,383 | * 11/1983 | Naem et al. | 148/187 |
| 4,792,534 | 12/1988 | Tsuji et al. | 437/229 |
| 5,296,410 | 3/1994 | Yang | 437/228 |
| 5,420,067 | 5/1995 | Hsu | 437/180 |
| 5,580,384 | 12/1996 | Thiebaud et al. | 118/723 |
| 5,643,638 | 7/1997 | Otto et al. | 427/569 |
| 5,654,917 | 8/1997 | Ogura et al. | 365/185.18 |
| 5,667,940 | 9/1997 | Hsue et al. | 430/312 |
| 6,180,465 | * 1/2001 | Gardner et al. | 438/291 |
| 6,191,034 | * 2/2001 | Klein et al. | 438/669 |
| 6,274,445 | * 8/2001 | Nouri | 438/300 |

FOREIGN PATENT DOCUMENTS

| | | |
|---|---|---|
| 0450091A | 10/1991 | (EP) . |
| 2283039 | 11/1990 | (JP) . |
| 4-207076 | * 7/1992 | (JP) . |

OTHER PUBLICATIONS

Patent Abstracts of Japan vol. 015, No. 054 (E–1031), Feb. 8, 1991 & JP 02 283039 A (Toshiba Corp), Nov. 20, 1990, abstract, p. 298.

Patent Abstracts of Japan, vol. 016, No. 542 9E–1290), Nov. 12, 1992 & JP 04 207076 A (Toshiba Corp),Jul. 29, 1992, abstract.

International Search Report for International Application No. PCT/US 00/06585.

* cited by examiner

*Primary Examiner*—Rosemary Ashton
(74) *Attorney, Agent, or Firm*—Amin & Turocy, LLP

(57) ABSTRACT

The present invention relates to a method for forming an etch mask. A photoresist layer is patterned, wherein $d_1$ is a smallest space dimension of an exposed area of a layer underlying the photoresist layer. An ARC layer under the photoresist layer is etched. A nitride layer is formed to be conformal to the patterned ARC layer and exposed portions of an underlayer underying the patterned ARC layer. The nitride layer is etched to form nitride sidewalls, the nitride sidewalls reducing the smallest space dimension of the exposed underlayer area to $d_2$, wherein $d_2<d_1$.

9 Claims, 5 Drawing Sheets

METHOD TO PRODUCE HIGH DENSITY MEMORY CELLS AND SMALL SPACES BY USING NITRIDE SPACER

TECHNICAL FIELD

The present invention generally relates to semiconductor processing, and in particular to a method for producing small space patterns via employment of a conformal nitride layer.

BACKGROUND OF THE INVENTION

In the semiconductor industry, there is a continuing trend toward higher device densities. To achieve these high densities there has been and continues to be efforts toward scaling down device dimensions (e.g., at submicron levels) on semiconductor wafers. In order to accomplish such high device packing density, smaller and smaller feature sizes are required. This may include the width and spacing of interconnecting lines, spacing and diameter of contact holes, and the surface geometry such as corners and edges of various features.

The requirement of small features with close spacing between adjacent features requires high resolution photolithographic processes. In general, lithography refers to processes for pattern transfer between various media. It is a technique used for integrated circuit fabrication in which a silicon slice, the wafer, is coated uniformly with a radiation-sensitive film, the resist, and an exposing source (such as optical light, x-rays, or an electron beam) illuminates selected areas of the surface through an intervening master template, the photo mask, for a particular pattern. The lithographic coating is generally a radiation-sensitive coating suitable for receiving a projected image of the subject pattern. Once the image is projected, it is indelibly formed in the coating. The projected image may be either a negative or a positive image of the subject pattern. Exposure of the coating through the photomask causes the image area to become either more or less soluble (depending on the coating) in a particular solvent developer. The more soluble areas are removed in the developing process to leave the pattern image in the coating as less soluble polymer.

The spacing between adjacent lines of an integrated circuit is an important dimension, and ever continuing efforts are made toward reducing such spacing dimension. The wavelength of light used in the photolithographic process along with the lithographic tool set employed in the process generally dictate the spacing dimension. For example, a tool set designed to provide lines and/or spaces at 0.18 $\mu$m does not achieve consistent lines and/or spacing at its minimum range of 0.18 $\mu$m but rather is employed to generate lines and/or spacing above the minimum range (e.g., 0.20 $\mu$m) with fairly consistent results.

In view of the above, it would be desirable for a technique which allows for a particular lithographic tool set to be employed and achieve consistent lines and/or spacing between lines at the minimum range of the tool set and even below the minimum range.

SUMMARY OF THE INVENTION

The present invention relates to a method for employing a photolithographic tool set and achieving substantially consistent spacing dimensions below the minimum range of the tool set. A given photolithographic tool set is employed to pattern a photoresist layer in a desired fashion. The tool set is capable of achieving a smallest spacing dimension between adjacent lines of $d_1$. After the photoresist layer is patterned, an etch step is performed to etch the pattern in an underlying ARC layer. Next, a nitride layer is conformably deposited over the patterned ARC layer. Thereafter, a directional etch is performed to remove a particular amount of the nitride layer (preferably a thickness equivalent to the thickness of the nitride layer residing over an ARC portion). The directional etch leaves nitride sidewalls along the patterned ARC portions which result in a reduction in dimension size of exposed areas interposed between adjacent ARC portions. Thus a spacing dimension size ($d_2$) of exposed areas is substantially less than the spacing dimension size ($d_1$) of exposed areas prior to the depositing the nitride layer. An etch step is performed to etch layers underlying the ARC layer. Adjacent lines etched from one of the underlayers will have a smallest spacing design dimension of $d_2$ as compared to $d_1$. Thus, the present invention provides for achieving spacing dimensions between lines at and below a minimum patterning range for a particular lithographic tool set.

One aspect of the invention relates to a method for forming an etch mask. A photoresist layer is patterned, wherein $d_1$ is a smallest space dimension of an exposed area of an ARC layer underlying the photoresist layer. The ARC layer is etched. A nitride layer is formed to be conformal to the patterned ARC layer and exposed portions of an underlayer underlining the ARC layer. The nitride layer is etched to form nitride sidewalls, the nitride sidewalls reducing the smallest space dimension of the exposed underlayer area to $d_2$, wherein $d_2<d_1$.

Another aspect of the invention relates to a method for producing a small space pattern in a semiconductor layer. A photoresist layer of a semiconductor structure is patterned with a photolithographic tool set, a minimum printed space dimension of the patterned photoresist being $d_1$, wherein $d_1$ is the smallest space dimension consistently printable by the photolithographic tool set. A nitride layer is formed to be conformal to a patterned ARC layer underlying the photoresist layer and exposed portions as an underlayer underlying the ARC layer, $d_1$ being the smallest dimension of the exposed portions. The nitride layer is etched an amount substantially equivalent to a minimum thickness parameter ($\gamma$) of the nitride to leave nitride sidewalls such that the smallest dimension of the exposed portions is now $d_2$, wherein $d_2<d_1$.

Another aspect of the invention relates to method of forming closely spaced lines from a polysilicon layer. A semiconductor structure is used, the semiconductor structure including: the polysilicon layer; and a patterned anti-reflective coating (ARC) layer over the polysilicon layer, wherein a smallest dimension of at least one exposed portion of the polysilicon layer equals $d_1$. A nitride layer is formed to conform to an exposed surface of the semiconductor structure. The nitride layer is etched so as to leave nitride portions along sidewalls of the ARC layer, the nitride portions reducing the smallest dimension of the at least one exposed portion of the polysilicon layer to $d_2$, wherein $d_2<d_1$.

Still another aspect of the invention relates to a method of forming closely spaced lines from a polysilicon layer. A photolithographic tool set is used to pattern a photoresist layer of a semiconductor structure wherein $d_1$ is a smallest space dimension consistently printable by the photolithographic tool set, the semiconductor structure including: the polysilicon layer; an anti-reflective coating (ARC) layer over the polysilicon layer; and the patterned photoresist layer over the ARC layer, wherein a smallest dimension of at least one exposed portion of the ARC layer equals $d_1$. The ARC layer is etched. The photoresist layer is removed. A nitride layer is formed to conform to remaining portions of the ARC layer and exposed portions of a polysilicon layer underlying the ARC layer. The nitride layer is etched so as to leave nitride sidewalls, the nitride sidewalls reducing the smallest dimension of the at least one exposed portion of the polysilicon layer to $d_2$, wherein $d_2<d_1$ The polysilicon layer is etched, wherein a smallest space dimension between at least two adjacent lines is substantially equal to $d_2$.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1A:
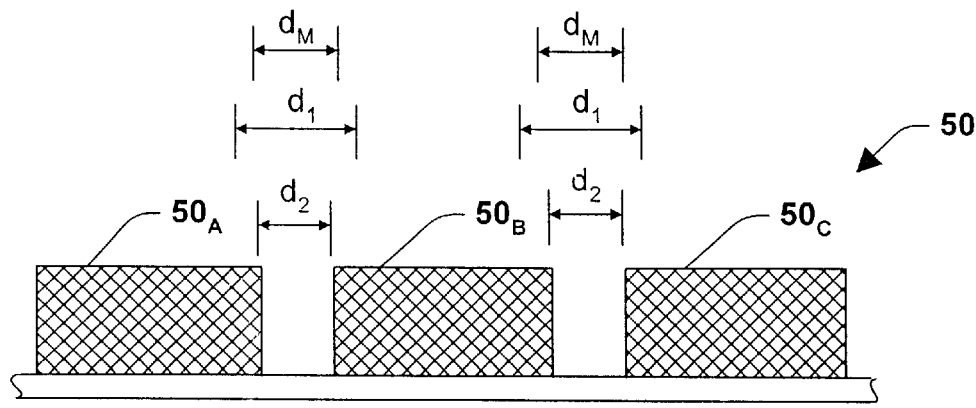
FIG. 1a is a schematic cross-sectional illustration of lines formed in accordance with the present invention.

The present invention will now be described with reference to the drawings. FIG. 1a illustrates a set of lines $50_A$, $50_B$ and $50_C$ (collectively referred to by reference numeral 50) formed in accordance with the present invention. The lines 50 are formed employing a photolithographic tool set (not shown) having a minimum feature printing dimension of $d_M$. More particularly, the smallest spacing between lines printable by the tool set has a dimension of $d_M$. However, consistent printing at the minimum spacing dimension $d_M$ is typically not possible. The tool set is capable of printing consistently at a spacing dimension of $d_1$ (which is larger than $d_M$). As can be seen from FIG. 1a, the present invention provides for employing the particular tool set to form the lines 50 such that a spacing dimension ($d_2$) between adjacent lines, respectively, is achieved. The dimension $d_2$ is substantially less than dimensions $d_M$ and $d_1$.

Figure 1B:
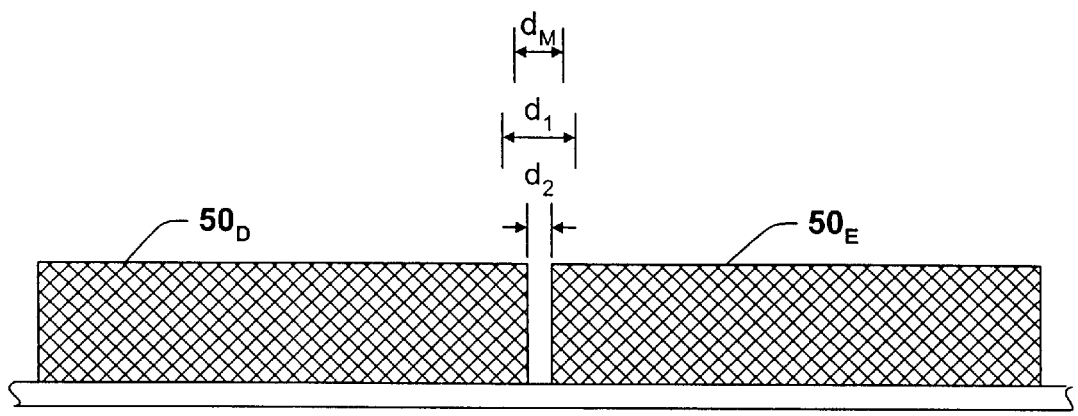
FIG. 1b is a schematic cross-sectional illustration of a ratio of line width to space width in accordance with the present invention.

FIG. 1b illustrates a ratio of line width to space width in accordance with the present invention. As is known, small spacing between adjacent lines having relatively large width is very difficult to achieve. The present invention provides for achieving a ratio of line width to space width of up to about 20:1. Lines $50_D$ and $50_E$ have widths, respectively, about twenty times greater than the space between the lines $50_D$ and $50_E$.

FIGS. 2–11 illustrate in greater detail how the present invention provides for forming the lines 50 having a spacing dimension there between, respectively, of $d_2$ using the tool set which has a minimum print feature dimension of $d_M$ (which is substantially greater than $d_2$).

Thus, the present invention provides for a method for employing a conventional tool set to obtain minimum space dimensions well below the minimum space parameter typically achievable by the tool set. As a result, the present invention provides for a relatively low cost alternative to purchasing new photolithographic tool sets for achieving reduced spacing between lines.

Figure 2:
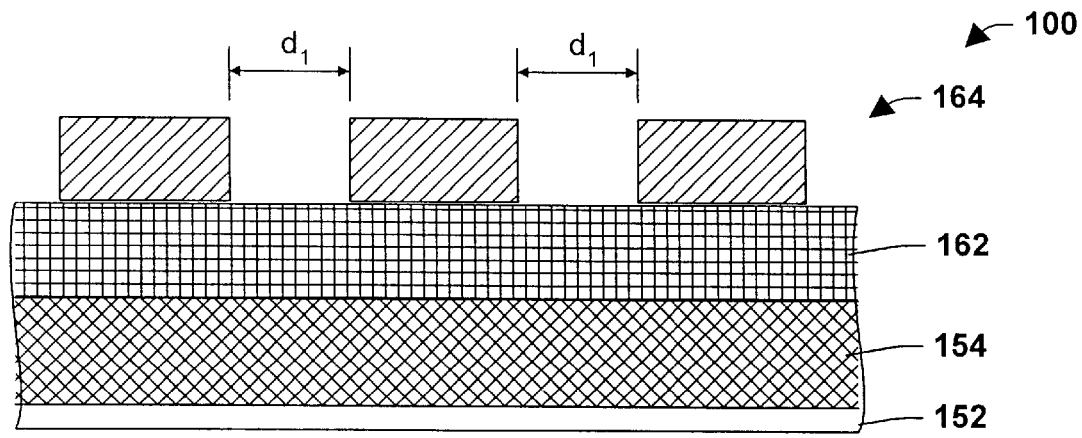
FIG. 2 is schematic cross-sectional illustration of a semiconductor structure including a polysilicon layer, an anti-reflective coating layer and a photoresist layer patterned with a tool set.

FIG. 2 illustrates a structure 100 which includes an oxide layer 152, a polysilicon layer 154, an anti-reflective coating layer 162 (e.g., SiON having a thickness within the range of 800A to 1500A) and a patterned photoresist layer 164. Formation of the structure 100 is well known in the art, and further detail regarding such is omitted for sake of brevity. The photoresist layer 164 has been patterned via a photolithographic tool set (e.g., deep ultra-violet (DUV)) tool set capable of patterning lines separated by distances equal to or greater than 0.18 $\mu$m). The patterned photoresist layer 164 will serve as a mask for the underlying layers during etch steps to form the lines 50. The distance $d_1$ is representative of the smallest space parameter consistently achievable by the photolithographic tool set.

Figure 3:
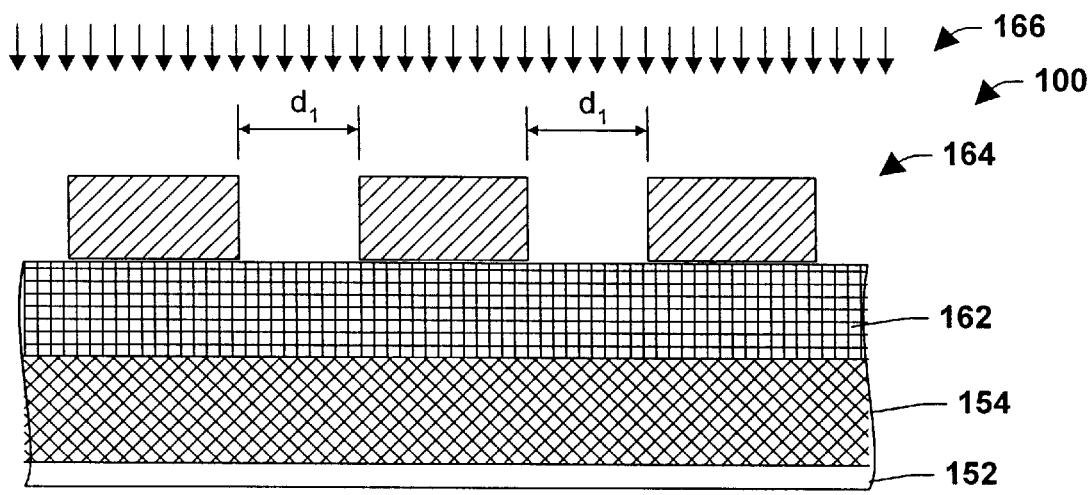
FIG. 3 is a schematic illustration of the semiconductor structure of FIG. 2 undergoing an etch step to etch a layer underlying the patterned photoresist layer in accordance with the present invention.

FIG. 3 illustrates an etch step 166 to etch exposed portions of the ARC layer 162.

Figure 4:
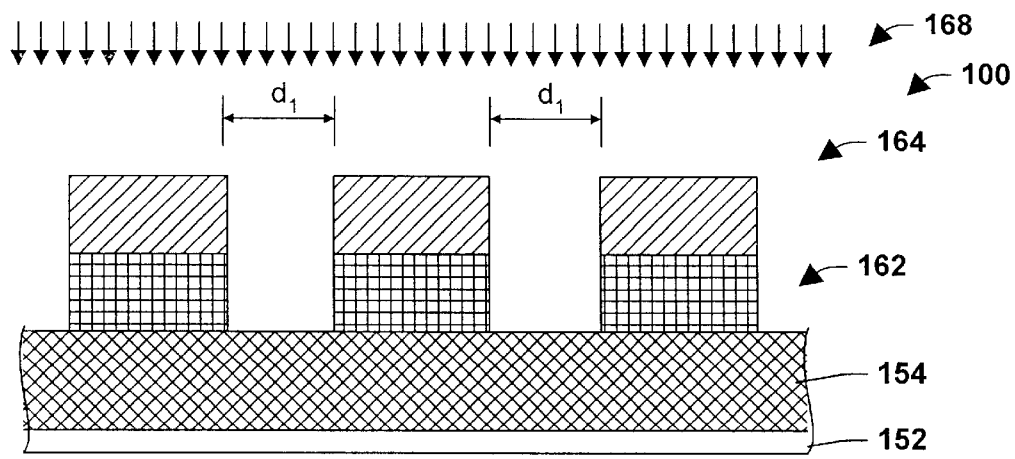
FIG. 4 is a schematic cross-sectional illustration of the structure of FIG. 3 after the underlayer etch step is complete, and illustrating the structure undergoing a photoresist stripping process in accordance with the present invention.

FIG. 4 illustrates a photoresist stripping step 168 to remove remaining portions of the photoresist layer 164.

Figure 5:
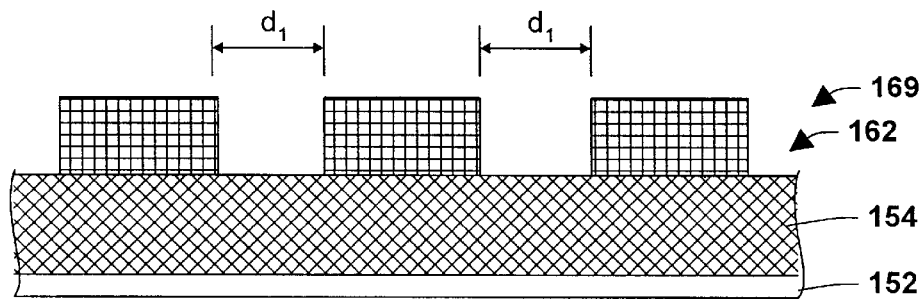
FIG. 5 is a schematic cross-sectional illustration of the structure of FIG. 4 after the photoresist has been removed in accordance with the present invention.

FIG. 5 illustrates a structure 169 formed after the etch step 166 and the stripping step 168 are substantially complete.

Figure 6:
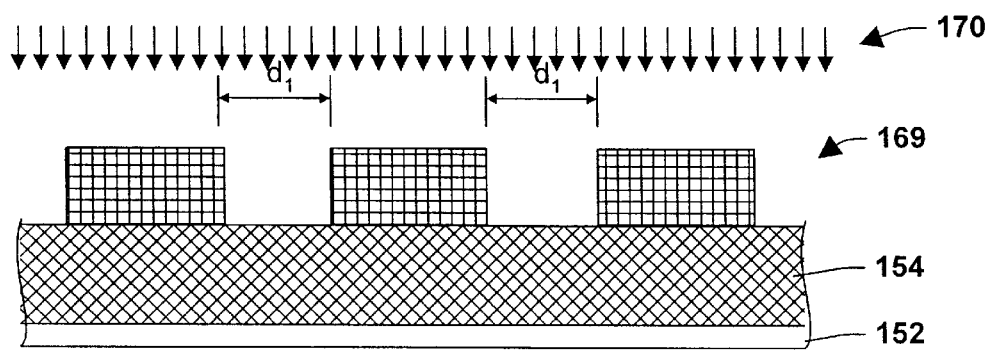
FIG. 6 is a schematic cross-sectional illustration of the structure of FIG. 5 undergoing a deposition process to conformably deposit a nitride layer on the structure in accordance with the present invention.
Figure 7:
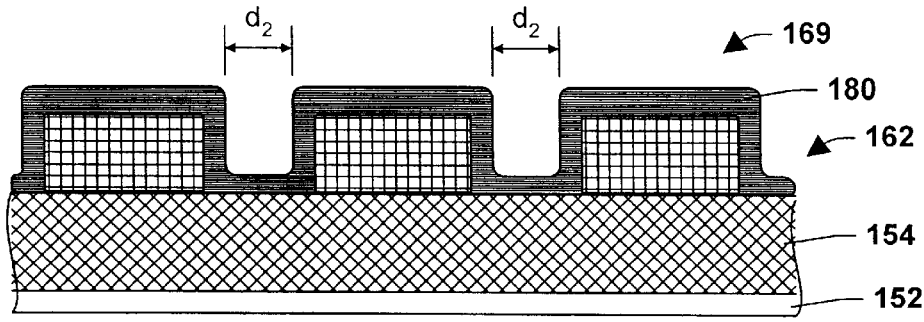
FIG. 7 is a schematic cross-sectional illustration of the structure of FIG. 6 after the nitride deposition step is substantially complete in accordance with the present invention.

FIG. 6 illustrates a nitride deposition step 170 performed on the structure 169 to form a nitrogen layer conformal to the exposed surface of the structure 169. More particularly, the etched ARC layer 162 is exposed to a nitrogen based chemistry to form a conformal nitride coating 180 (FIG. 7) on the ARC layer 162. It is to be appreciated that one skilled in the art could readily tailor without undue experimentation a suitable chemistry to form the conformal nitride coating 80. The etch chemistry and duration thereof may be suitably tailored to form the nitride coating at substantially any desired thickness (e.g., between about the range of 10–1000 Å).

Figure 8:
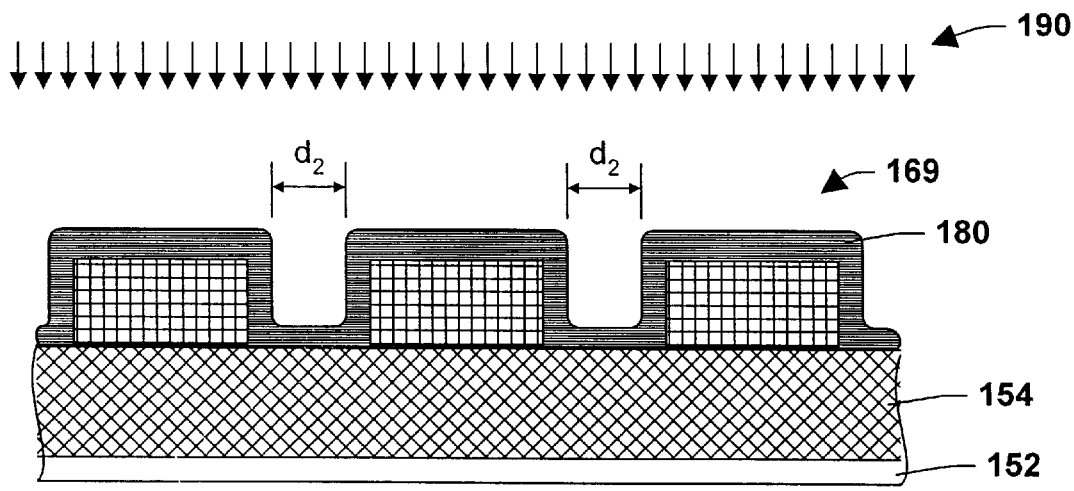
FIG. 8 is a schematic cross-sectional illustration of the structure of FIG. 7 undergoing a directional etch step in accordance with the present invention.

FIG. 8 illustrates a directional etch step 190 being performed to remove a predetermined thickness of the nitride layer 180. Preferably, a dry directional etch is performed to remove an amount of the nitride layer 180 equivalent to the conformal thickness of the nitride layer 180.

Figure 9:
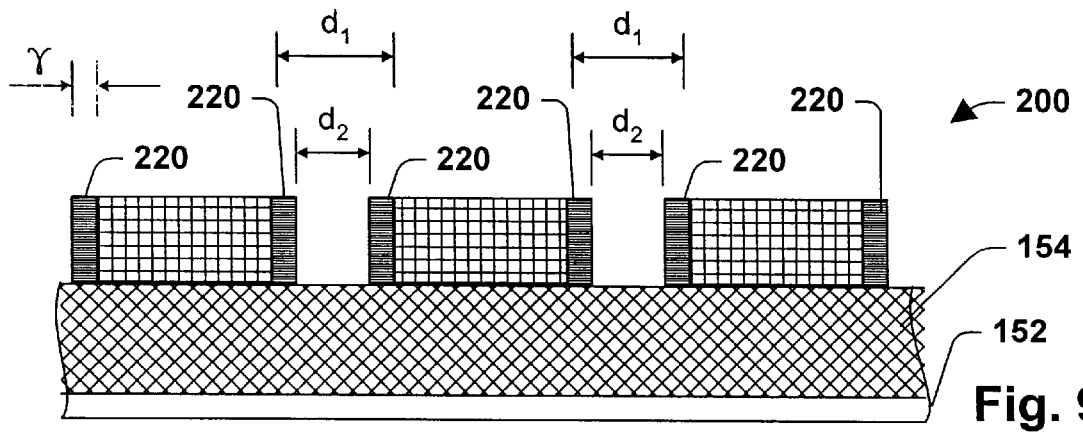
FIG. 9 is a schematic cross-sectional illustration of the structure of FIG. 8 after the directional etch step is substantially complete in accordance with the present invention.

Substantial completion of the etch step 190 results in a structure 200 shown in FIG. 9. The structure 200 includes nitride sidewalls 220 which result in exposed portions of the polysilicon layer 154 having a dimension of $d_2$. The dimension $d_2$ is less than the dimension $d_1$ (FIG. 2). The dimension $d_2$ may be controlled via the controlling the thickness ($\gamma$) of the nitride layer 180. For example, the dimension $d_2$ may be controlled according to the following relationship:

$$d_2 = d_1 - 2\gamma$$

Since there are two nitride sidewalls 220 within a particular dimension $d_1$, the value of $d_2$ equals $d_1$ less twice the nitride layer thickness ($\gamma$).

Figure 10:
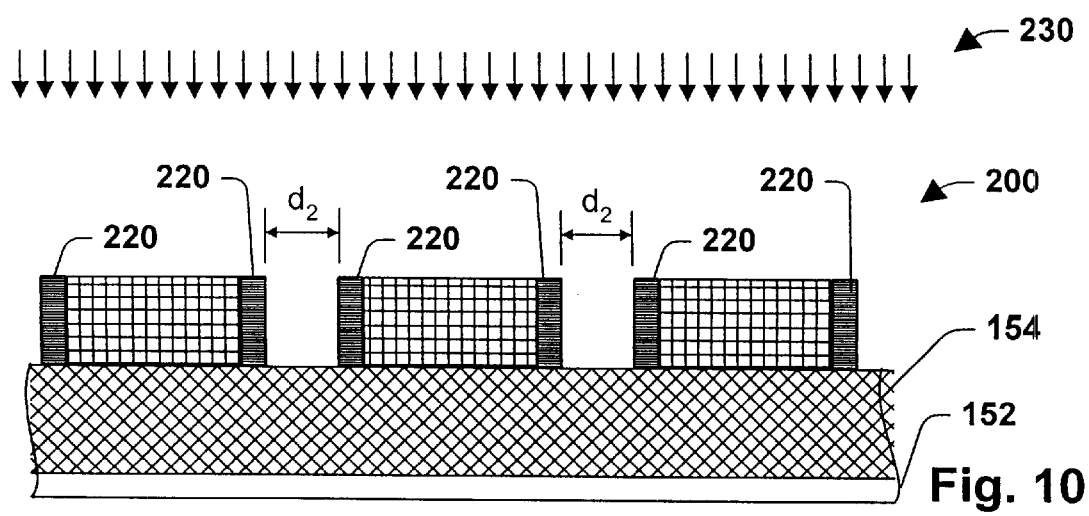
FIG. 10 is a schematic cross-sectional illustration of the structure of FIG. 9 undergoing a poly etch step to form lines in accordance with the present invention.
Figure 11:
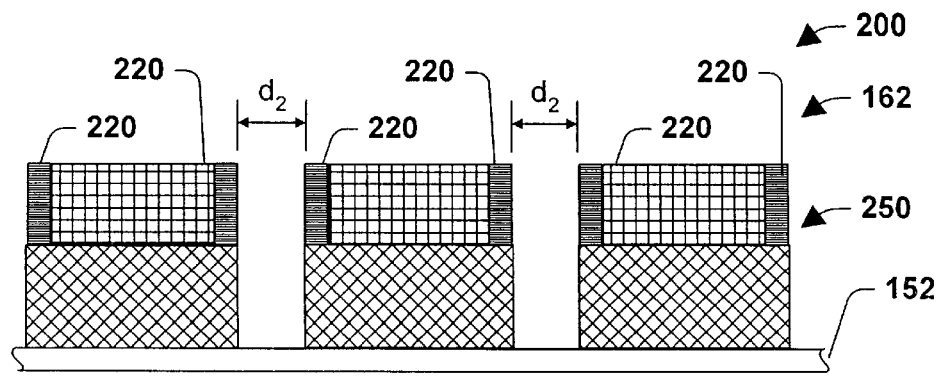
FIG. 11 is a schematic cross-sectional illustration of the structure of FIG. 10 after the poly etch step is substantially complete in accordance with the present invention.

Next, referring to FIG. 10, a poly etch 230 is performed to etch exposed portions of the polysilicon layer 154 so as to form lines 250 (FIG. 11) having a spacing there between, respectively, of $d_2$.

Figure 12:
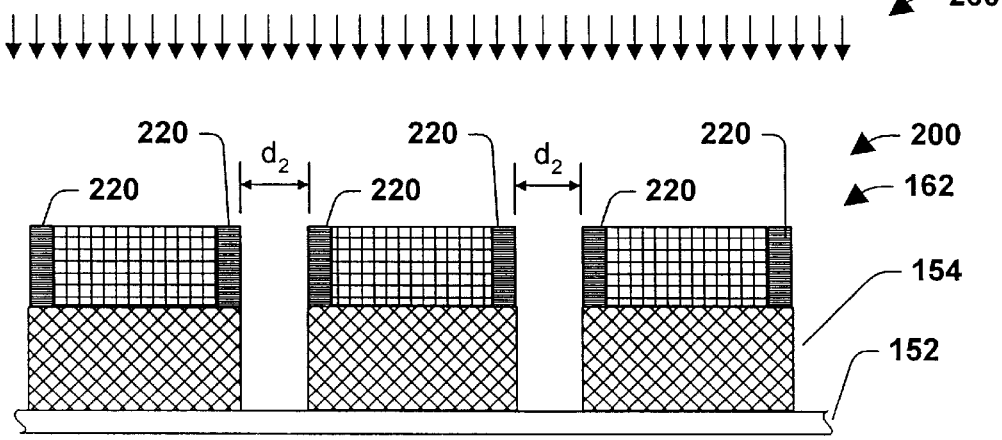
FIG. 12 is a schematic cross-sectional illustration of the structure of FIG. 11 undergoing a stripping process to remove remaining portions of the nitride layer and ARC layer in accordance with the present invention.

FIG. 12 illustrates a stripping step 260 to remove remaining portions of the ARC layer 162 and nitride sidewalls 220.

Figure 13:
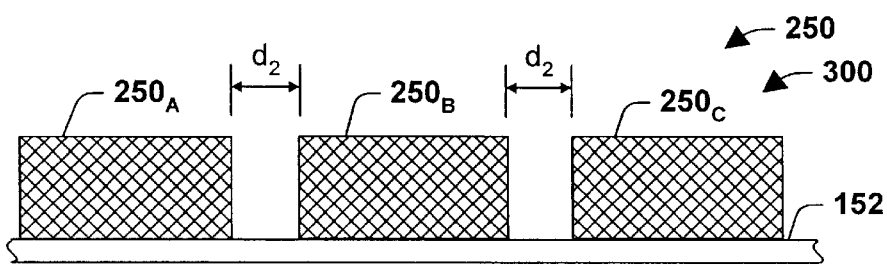
FIG. 13 is a schematic cross-sectional illustration of the structure of FIG. 12 substantially complete in relevant part in accordance with the present invention.

FIG. 13 illustrates a structure 300 including the lines 250 having a spacing dimension between adjacent lines (e.g., $250_A$ and $250_B$) substantially equal to $d_2$. Thus, for example, if a 0.18 $\mu$m tool set were employed to pattern the photoresist 164 with a spacing dimension $d_1 = 0.20$ $\mu$m and the nitride layer 80 was formed to have a thickness ($\gamma$) of 0.03 $\mu$m, the resulting spacing dimension between adjacent lines $50_A$ and $50_B$ would be approximately 0.14 $\mu$m=(0.20 $\mu$m−2(0.03 $\mu$m)). The minimum space dimension ($d_M$) for the 0.18 $\mu$m tool set employed is 0.18 $\mu$m, and such minimum space dimension typically would be difficult to achieve consistently in accordance with conventional techniques. However, by employing the present invention the same 0.18 $\mu$m tool set can be employed to achieve with substantial consistency minimum space dimensions between lines at and below the minimum space dimension parameter of the tool set.

Employing the present invention achieves with substantial consistency minimum space dimensions between lines at and below the minimum space dimension parameter of a particular tool set employed.

Figure 14:
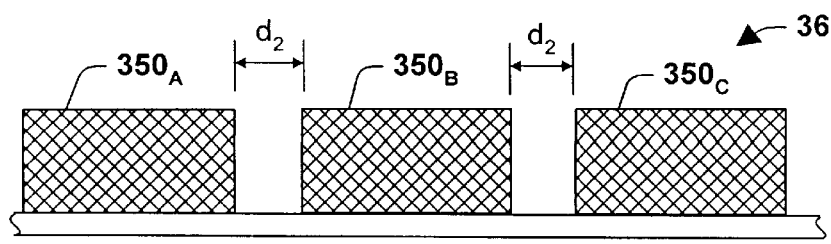
FIG. 14 is a schematic cross-sectional illustration of floating gates formed in accordance with the present invention.

Although the present invention has been described primarily in the context of forming lines, it is to be appreciated that the present invention may be applied to forming other features (e.g., floating gates of flash memory devices and/or embedded flash memory devices) where achieving small space dimension between adjacent features is desired. For example, as shown in FIG. 14 the principles of the present invention may be employed in the formation of closely spaces floating gates $350_A$, $350_B$ and $350_C$ of a memory device 360.

The present invention provides for a method for employing a particular photolithographic tool set to obtain minimum space dimensions well below the minimum space parameters typically obtainable by the tool set.

What has been described above are preferred embodiments of the present invention. It is, of course, not possible to describe every conceivable combination of components or methodologies for purposes of describing the present invention, but one of ordinary skill in the art will recognize that many farther combinations and permutations of the present invention are possible. Accordingly, the present invention is intended to embrace all such alterations, modifications and variations that fall within the spirit and scope of the appended claims.

What is claimed is:

1. A method of forming closely spaced features from a polysilicon layer, comprising the steps of:
   using a semiconductor structure including: the polysilicon layer, an anti-reflective coating (ARC) layer over the polysilicon layer, wherein a smallest dimension of at least one exposed portion of the polysilicon layer equals $d_1$;
   forming a nitride layer to conform to an exposed surface of the semiconductor structure, wherein the nitride layer is formed to have a minimum thickness of $\gamma$; and
   etching the nitride layer so as to leave nitride portions along sidewalls of the ARC layer, the nitride portions reducing the smallest dimension of the at least one exposed portion of the polysilicon layer to $d_2$, wherein the dimension $d_2$ is predetermined according to the relationship $d_2 = d_1 - 2\gamma$.

2. The method of claim 1 further including the step of forming the nitride layer to have a thickness ($\gamma$).

3. The method of claim 1 further including the step of using SiON in the ARC layer.

4. The method of claim 1 wherein the features are lines and a ratio of line width to space width is between the range of about 20:1 to 1:1.

5. The method of claim 1 wherein the features are lines and a ratio of line width to space width is between the range of about 20:1 to 10:1.

6. The method of claim 1 wherein the features are floating gates.

7. A method of forming closely lines from a polysilicon layer, comprising the steps of:

patterning a photoresist layer of a semiconductor structure wherein $d_1$ is a smallest space dimension printed on the photoresist layer, the semiconductor structure including: the polysilicon layer; an antireflective coating (ARC) layer over the polysilicon layer; and the patterned photoresist layer over the ARC layer, wherein a smallest dimension of at least one exposed portion of the ARC layer substantially equals $d_1$;

etching the ARC layer;

removing the photoresist layer;

forming a nitride layer to conform to remaining portions of the ARC layer and exposed portions of a polysilicon layer underlying the ARC layer, wherein the nitride layer is formed to have a minimum thickness of $\gamma$;

etching the nitride layer so as to leave nitride sidewalls, the nitride sidewalls reducing the smallest dimension of the at least one exposed portion of the polysilicon layer to $d_2$, wherein the dimension $d_2$ is predetermined according to the relationship $d_2 = d_1 - 2\gamma$; and etching the polysilicon layer, wherein a smallest space dimension between at least two adjacent lines is substantially equal to $d_2$.

8. The method of claim 7, further including the step of forming the nitride layer to have a thickness ($\gamma$) with the range of about 10–1000Å.

9. The method of claim 7 wherein the ARC layer includes SiON.

* * * * *

UNITED STATES PATENT AND TRADEMARK OFFICE
CERTIFICATE OF CORRECTION

PATENT NO. : 6,329,124 B1
DATED : December 11, 2001
INVENTOR(S) : Bharath Rangarajan et al.

It is certified that error appears in the above-identified patent and that said Letters Patent is hereby corrected as shown below:

<u>Column 1,</u>
Line 21, please replace "comers" with -- corners --.

<u>Column 6,</u>
Line 40, please replace "farther" with -- further --.

Signed and Sealed this

Nineteenth Day of March, 2002

Attest:

Attesting Officer

JAMES E. ROGAN
*Director of the United States Patent and Trademark Office*